(12) United States Patent
Sinha et al.

(10) Patent No.: US 11,048,581 B2
(45) Date of Patent: Jun. 29, 2021

(54) STORAGE DEVICE TELEMETRY FOR PROVISIONING I/O

(71) Applicant: Samsung Electronics Co., Ltd., Suwon-si (KR)

(72) Inventors: Vikas K. Sinha, Sunnyvale, CA (US); Indira Joshi, Saratoga, CA (US); Stephen G. Fischer, Mountain View, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 97 days.

(21) Appl. No.: 15/872,927

(22) Filed: Jan. 16, 2018

(65) Prior Publication Data
US 2019/0155682 A1  May 23, 2019

Related U.S. Application Data
(60) Provisional application No. 62/588,118, filed on Nov. 17, 2017.

(51) Int. Cl.
| | | |
|---|---|---|
| *G06F 11/00* | (2006.01) | |
| *G06F 11/10* | (2006.01) | |
| *G11C 16/34* | (2006.01) | |
| *G06F 11/07* | (2006.01) | |
| *G11C 29/52* | (2006.01) | |
| *G11C 29/04* | (2006.01) | |

(52) U.S. Cl.
CPC ...... *G06F 11/1008* (2013.01); *G06F 11/0706* (2013.01); *G06F 11/0766* (2013.01); *G11C 16/3431* (2013.01); *G11C 29/52* (2013.01); *G11C 2029/0409* (2013.01)

(58) Field of Classification Search
CPC ............... G06F 11/0745; G06F 11/076; G06F 11/0781; G06F 11/0787; G06F 11/3447; G06F 11/3452; G06F 11/3485; G11C 16/3431
See application file for complete search history.

(56) References Cited

U.S. PATENT DOCUMENTS

| | | | |
|---|---|---|---|
| 6,493,656 B1 | 12/2002 | Houston et al. | |
| 7,580,813 B2 * | 8/2009 | Thiesson | G06F 17/18 700/31 |
| 7,757,124 B1 | 7/2010 | Singh et al. | |
| 8,516,343 B2 * | 8/2013 | Flynn | G06F 11/108 714/773 |
| 8,806,106 B2 * | 8/2014 | Goss | G11C 16/349 711/103 |
| 8,874,835 B1 * | 10/2014 | Davis | G06F 3/0679 711/103 |
| 9,251,019 B2 * | 2/2016 | Losh | G06F 11/2053 |
| 9,274,865 B2 | 3/2016 | Furlong | |
| 9,350,391 B1 | 5/2016 | Anderson et al. | |
| 9,411,718 B2 | 8/2016 | Cohen et al. | |

(Continued)

*Primary Examiner* — Elmira Mehrmanesh
(74) *Attorney, Agent, or Firm* — Lewis Roca Rothgerber Christie LLP

(57) ABSTRACT

A system and method for advanced storage device telemetry. The system includes multiple SSDs. I/O is executed on the SSDs in conjunction with a host software. As the I/O is executed, error log information is stored in a persistent memory as well as in a volatile memory. In various embodiments, granular performance information for the execution of the I/O is also stored in a persistent memory.

14 Claims, 5 Drawing Sheets

(56) References Cited

U.S. PATENT DOCUMENTS

| | | | |
|---|---|---|---|
| 9,460,008 B1 | 10/2016 | Leshinsky et al. | |
| 10,534,767 B2* | 1/2020 | Cao | G06F 11/1469 |
| 2006/0282301 A1* | 12/2006 | Olson | G06Q 10/06 |
| | | | 705/7.38 |
| 2009/0125671 A1* | 5/2009 | Flynn | G06F 9/52 |
| | | | 711/103 |
| 2010/0313084 A1 | 12/2010 | Hida et al. | |
| 2012/0304039 A1* | 11/2012 | Peterson | G06F 11/10 |
| | | | 714/773 |
| 2013/0007380 A1* | 1/2013 | Seekins | G06F 3/0616 |
| | | | 711/154 |
| 2014/0059405 A1* | 2/2014 | Syu | G11C 16/349 |
| | | | 714/773 |
| 2014/0222992 A1* | 8/2014 | Goodman | G06F 3/065 |
| | | | 709/224 |
| 2014/0229794 A1 | 8/2014 | Gurgi et al. | |
| 2014/0229799 A1 | 8/2014 | Hubris et al. | |
| 2015/0067238 A1* | 3/2015 | Marcu | G06F 12/0246 |
| | | | 711/103 |
| 2016/0110249 A1* | 4/2016 | Orme | G06F 12/0238 |
| | | | 714/6.24 |
| 2018/0060193 A1* | 3/2018 | Knauft | G06F 11/0754 |
| 2019/0114247 A1* | 4/2019 | Chen | H04L 41/142 |

\* cited by examiner

STORAGE DEVICE TELEMETRY FOR PROVISIONING I/O

CROSS-REFERENCE TO RELATED APPLICATION(S)

The present application claims priority to, and the benefit of, U.S. Provisional Patent Application No. 62/588,118, filed on Nov. 17, 2017, the contents of which are incorporated herein by reference in its entirety.

BACKGROUND

1. Field

Some embodiments of the present disclosure relate generally to memory solid state drive (ssd) monitoring and reporting.

2. Description of the Related Art

Storage device telemetry data may be utilized in a number of ways from managing device workloads to predicting device failures. Various storage interface standards define the SSD device attributes that can be exchanged with host software for analysis. These devices attributes are generally categorized under Self-Monitoring, Analysis and Reporting Technology (SMART) attributes. Typically, a storage interface includes log pages that are populated with the SMART attributes and provided to the host software. The typical information provided through SMART attributes and other log pages is a snapshot of some of the SSD's operational attributes at a given time as well as some cumulative statistics over longer periods of time (e.g. the life of the device). While such information is useful, the limited scope of the information limits functionality to assist host software with making necessary device usage changes to match the dynamic nature of workload performance requirements. An improved device telemetry system is therefore desired.

The above information is only for enhancement of understanding of the background of embodiments of the present disclosure, and therefore may contain information that does not form the prior art.

SUMMARY

Some embodiments of the present disclosure provide a system and method for advanced storage device telemetry system. The system includes at least one solid state drive (SSD), a memory, and a processor. In various embodiments, execute instructions that, cause the processor to execute at least one Input/Output (I/O) instruction on the at least one SSD. In various embodiments, the system may store an error log information in a persistent memory for each of the at least one I/O instruction that fails to execute and store at least one granular performance information related to the execution of each of the at least one I/O instruction.

In various embodiments, the instructions are further configured to cause the processor to provision one of the at least one SSD based on a stored at least one granular performance information and a Quality of Service requirement.

In various embodiments, the at least one granular performance information includes at least one of a current number of IOPS, an average number of IOPS, a max throughput, an available throughput, a latency, a number of host read commands, a number of host write commands, a number of host read/write commands that have misaligned buffers, and a number of recoverable errors.

In various embodiments, the instructions are further configured to cause the processor to provision one of the at least one SSD for the execution of the at least one I/O based on an error log information and a Quality of Service requirement.

In various embodiments, the error log information includes at least one of an error count, an error timestamp, a command opcode, a status field, an LBA, a namespace, a port, and an error log information overflow flag.

In various embodiments, the at least one granular performance information is stored in a rolling time window.

In various embodiments the instructions are further configured to cause the processor to provide the at least one granular performance information for each of the at least one SSD as features to a machine learning model, classify each of the at least one SSD based on the output of the machine learning model, and provision the execution of the at least one I/O instruction based on the classification.

BRIEF DESCRIPTION OF THE DRAWINGS

Some embodiments can be understood in more detail from the following description taken in conjunction with the accompanying drawings, in which.

DETAILED DESCRIPTION

Figure 1:
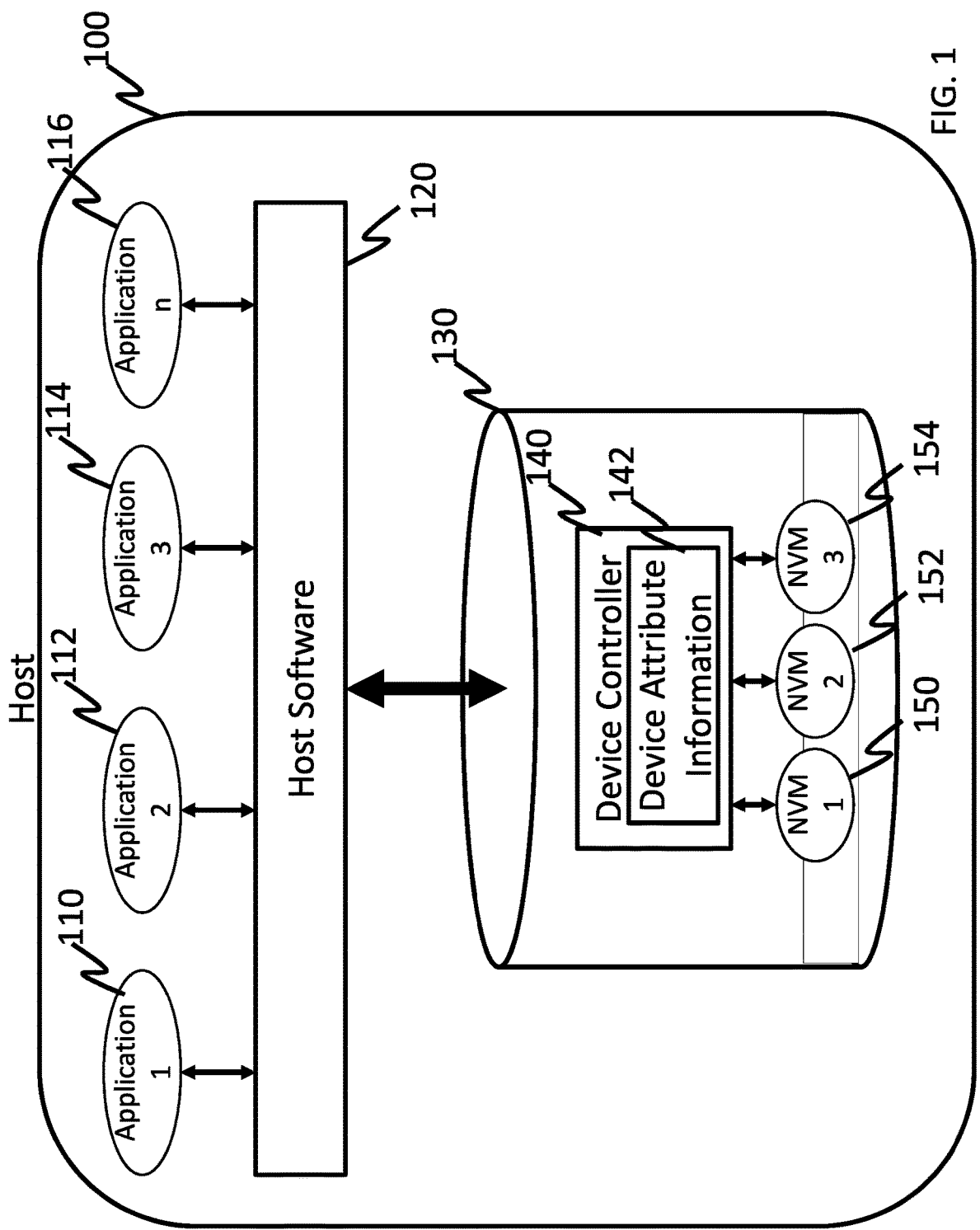
FIG. 1 depicts a system architectural overview according to an embodiment of the present invention.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments of the present invention include a system and method for advanced storage device telemetry. In scale-out systems, variations in internal device metrics present opportunities for analyzing workloads and device capabilities. A better understanding of how the devices are actually operating using the reporting data therefore allows for better utilization of system-wide storage resources. The system and methods include improved device attribute logging and offering finer granular performance statistics. In various embodiments, a rolling time window may be employed for performance modeling across different time periods. The improved telemetry data may be analyzed by an application operating on a storage server (e.g. host software) and be employed to improve workload provisioning and overall quality of service. For example, using the improved telemetry may allow for the host I/O stack to better isolate workloads based on I/O sizes. In other examples, devices can be classified into different performance levels (or performance categories) for I/Os of various sizes based on the attributes (for instance, performance metrics such as IOPS, throughput and average latency) reported by each device for each I/O size, and devices may then be selected for each I/O by matching each I/O to a best fitting device based on the I/O size and the performance attributes reported by the device.

In some embodiments, a machine learning classification model is deployed for predicting device performance based on the device's attributes, current I/O, and latency statistics. In some embodiments, a machine learning model is deployed within the I/O path to improve data placement and devices selection.

FIG. 1 depicts a system architectural overview according to an embodiment of the present invention.

Referring to FIG. 1, a host 100 (e.g. a server) is configured for advanced device telemetry according to various embodiments. The host includes multiple applications 110-116 that each perform various input/output (I/O) requests. The host software 120 receives the I/O requests and fulfills them either directly or by performing a storage operation (e.g. provisioning space or executing a load or store etc.) on the data storage 130. The host software 120 is also configured to provision storage resources based on data storage workload. For example, the data storage 130 may include a device controller 140 and multiple attached storage devices 150-154. The multiple attached storage devices 150-154 may, for example, include non-volatile memory (NVM) devices such as solid state drives (SSDs) attached using various connections such as PCIe. Each of the storage devices 150-154 has performance attributes related to the devices capabilities (e.g. max bandwidth, available space, etc.), how the device is actually performing (IOPS, throughput, tail latency, errors count, etc.), and other information (e.g. device temperature, counts of thermal throttling events, internal write amplification, and counts of remaining flash device program-erase cycles). The device attributes may be periodically received at the device controller 140 and stored in a dedicated device attribute storage 142. The device controller 140 may store some device attributes (e.g. error logs) in a volatile memory in accordance with various standards and store further attributes in a NVM memory. In some embodiments, the volatile and non-volatile memories may be on each of the storage devices 150-154. The host software 120 may periodically (e.g. at set time intervals, or after an asynchronous event) receive the stored device attribute information and provision I/O accordingly. For example, the host software 120 may provision I/O based on quality of service (QoS) requirements for each of the applications 110-116.

As an example of the usage of this information, the host system may request and read the write amplification values reported by each flash-based storage device in a cluster, and compute the associated average and standard deviation values. If the write amplification reported by a flash device exceeds the average by a specified multiple of the standard deviation, then the host system may classify the device as having a high write amplification value compared to the population of devices. Then, if an I/O command is issued by an application that has requested a QoS setting for high throughput, the host system may not select the device with high write amplification value for that I/O, instead selecting another device in a cluster that has reported a lower write amplification value.

As another example, the host system may request and read the counts of thermal throttling events reported by the devices in the cluster, and compute the associated average and standard deviation values. If the count of thermal throttling events reported by a flash device exceeds the computed average by a specified multiple of the standard deviation, then the host system may classify the device as having a high thermal throttling count value compared to the population of devices. Then, if an I/O command is issued by an application that has requested a QoS setting for high IOPS, the host system may not select the device with high thermal throttling value for that I/O, instead selecting another device in a cluster that has reported a lower thermal throttling value.

Figure 2:
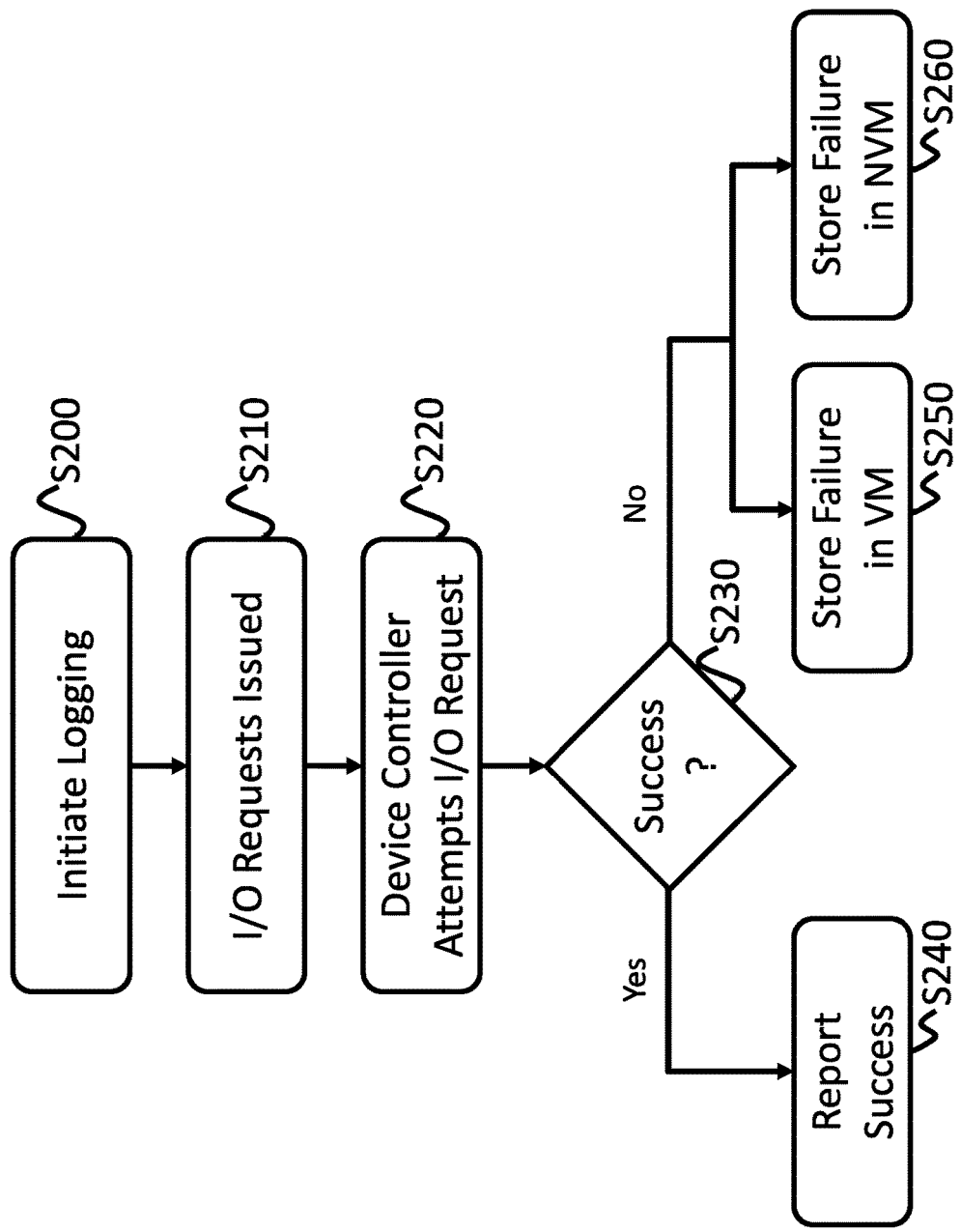
FIG. 2 is a flow chart detailing a method of processing errors according to an embodiment of the present invention.

FIG. 2 is a flow chart detailing a method of processing errors according to an embodiment of the present invention.

Referring to FIG. 2, the advanced device telemetry system may be configured to report storage device error history to the host software. For example, the stored device attribute information may include a history of command errors. The history of command errors may then be utilized by the host software to derive additional insights into the device's operational status and trends, and to predict future errors and performance. Command error history logging may be initiated by the host software to the device controller (S200). The host operates normally and the host software (or a peer device that is attached to the host) can issue I/O requests to the device controller (S210). The device controller then attempts to execute the I/O (S220). The device controller determines whether the I/O command was successfully executed (S230). When the I/O command was successfully executed, the device controller reports the success to the requestor (e.g. the host software or the requesting peer) (S240). When the command is not successfully executed, the error log information may be stored in a volatile memory for further processing as defined by various standards (S250) and stored in a persistent error log in a NVM (S260).

For example, in various embodiments, the additional log information may be stored in a persistent error log (e.g. a log page) in NVM for future reporting to the host software. In various embodiments, the size of the persistent memory may be designated by the host software as part of one or more of the attached NVM devices (e.g. SSDs). The log information may include an error count, a timestamp for each error, a command opcode for each error, a status field, a logical block address (LBA) associated with the error, a namespace associated with each error, a port associated with each error, and any additional information relevant to each command error. In various embodiments, an Error Log Information Overflow Flag may be included in the log information to indicate that the persistent error log has filled the designated NVM. When the flag is activated, the host software may be alerted (e.g. via an asynchronous event) that the devices have run out of free space to persistently store command error log history. In some embodiments, the system may be configured to support wrap-around of the persistent error log (e.g. overwriting the oldest log data with incoming new log data) once the NVM is full. In another embodiment, the host software may be configured to reset (e.g. clear) the persistent memory used to store the persistent error log. In one embodiment, the persistent error log information may include the various fields outlined by Table 1.

TABLE 1

Persistent Error Log Fields

| Field | Description |
| --- | --- |
| Error Count | This is a 64-bit incrementing error count, indicating a unique identifier for this error. The error count starts at 1 h, is incremented for each unique error log entry, and is retained across power off conditions. |
| Timestamp of the error | This field includes the timestamp of when the error was first reported. The latest error should be at the front of the list. |
| Command Opcodes | This field indicates the Opcode that is associated with the error. |
| Status Field | This field indicates the Status Field for the command that completed. |
| LBA | This field indicates the first LBA that experienced the error condition, if applicable. |
| Namespace | This field indicates the namespace that the error is associated with, if applicable. |
| Port | This field indicates the port of the SSD that the command associated with the error. |
| Error Log Information Overflow Flag | This field indicates that the Command Error Log Page has overflown the assigned memory and the controller cannot store any additional information. This should result in an asynchronous event notification to the host software for corrective action. |
| Additional information relevant to the specific command error | Environmental conditions when the error occurred, e.g. temperature, power; Flash error locality: die/plane/block; Activity information when error occurred: snapshot (e.g. over past 1 s or 100 ms) of current host interface bandwidth, number of active flash die - in case load impacts error. |

Figure 3:
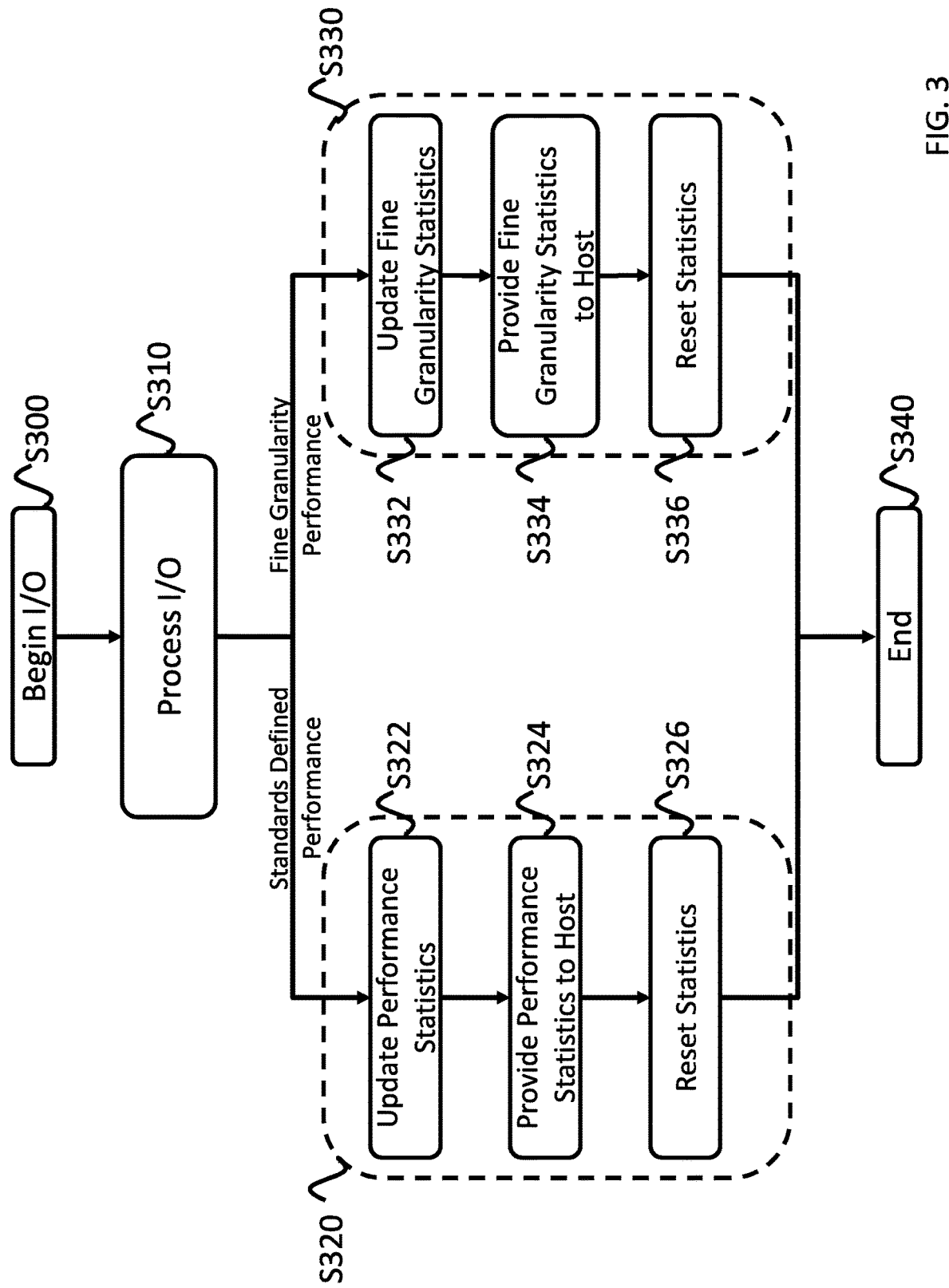
FIG. 3 depicts a function block diagram for providing finer granular performance statistics according to various embodiments.

FIG. 3 depicts a function block diagram for providing finer granular performance statistics according to various embodiments.

Referring to FIG. 3, the various applications operating on the host system may begin to issue I/O commands via the host software (S300). As discussed above, a device controller processes the I/O commands (S310) and while processing the I/O commands, the device controller is configured to perform two levels of logging. For example, the device controller is configured to update standards defined performance statistics (S320). Updating the standards defined statistics may include, for each storage volume that a device exposes to the software, updating the performance statistics that are defined by storage interface standards (S322). The performance statistics may then be returned to the host software in response to a host software log page request for the SMART attributes (S324). The device log information may then be reset as defined by a standard (S326). While updating the standards defined performance statistics, the device controller may also update finer granular performance statistics (S330). Updating the finer granular performance statistics may include, for each storage volume that a device exposes to the host software, logging host read commands, host write commands, host read/write commands that have misaligned buffers, the cumulative number of recoverable (e.g. correctable) errors, and any other device information related to device performance (S332). In some embodiments, logging host read commands may include the number of read commands completed by the controller for a namespace. The total number of read commands may then be divided based on I/O sizes, specified as a multiple of sector size. For example, numbers may be divided as: 1-8 512 B sectors (512 B up to 4 KB); 9-16 512 B sectors (>4 KB up to 8 KB); 17-32 512 B sectors (>8 KB up to 16 KB); 33-64 512 B sectors (>16 KB up to 32 KB); 65-128 512 B sectors (>32 KB up to 64 KB) etc. The performance information may be returned to the host software in response to a log request for finer granular performance information (S334) and the performance log may be reset (S336). At any time, the host software may end finer granular performance logging (S340).

In various embodiments, the finer granularity performance information may be used by the host to derive further insights into a device's operational status and trends. For example, the host may determine, based on the finer granularity information regarding the number of recovered errors, that the rate of recovered errors encountered by the device is increasing. Based on this determination, the host may initiate a replication process that copies data from the device on to other devices with lower rates of recovered errors, and, when the replication process is completed, may fail and replace the former device with the latter. The finer granular performance information may also be captured as a time series/rolling window for further analysis as will be discussed below.

Figure 4:
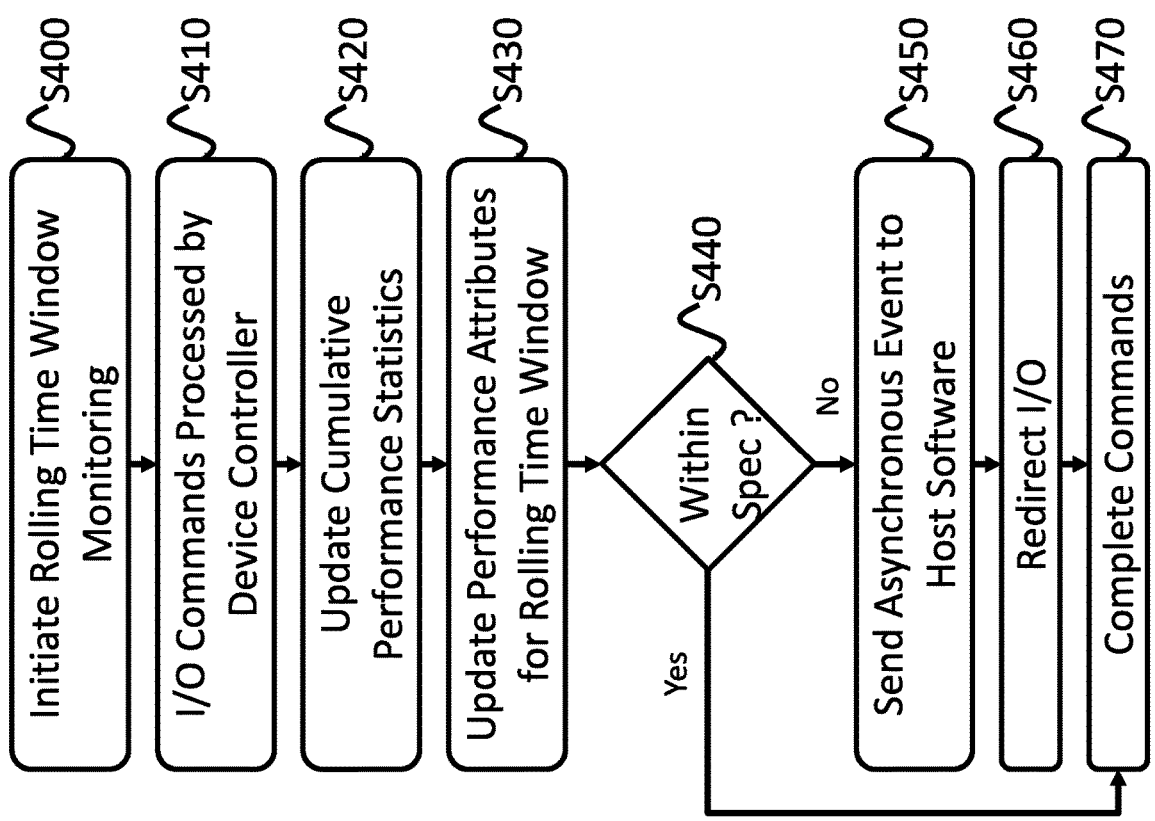
FIG. 4 depicts a method of performing rolling time window performance monitoring according to various embodiments.

FIG. 4 depicts a method of performing rolling time window performance monitoring according to various embodiments.

Referring to FIG. 4, in various embodiments, the device controller may be configured to measure and calculate device performance attributes over a specified rolling time window. In various embodiments, a rolling time window may have a preselected length and allows for sampling of the performance statistics at specified intervals during the window. Utilizing the rolling time window may allow for the host software to identify trends that are identifiable in each time window. In various embodiments, multiple rolling time windows having multiple durations may be utilized. Accordingly, the rolling time window performance monitoring may be initiated by the host application (S400) and the device controller may begin processing I/O commands (S410). As the I/O commands are processed, the device controller may update cumulative performance statistics (S420). For example, the device controller may be configured to calculate the mean, median, and variance of device performance such as IOPS, throughput, average latency, recovered errors, write amplification values, temperature and thermal throttling event counts, and other attributes relative to a rolling time window whose length is specified by the host. The device controller updates performance attributes over a preconfigured rolling time window (S430). For example, in some embodiments, the performance statistics may include cumulative performance statistics and each rolling time window's performance statistics may be compared to a device specification (e.g. each statistic may be compared to a threshold). When a performance statistic is not within an acceptable range, an asynchronous event may be generated and sent to the host software (S450). In some embodiments, the host software may be configured to set a threshold for a device's acceptable performance level. In another embodiment, the comparison may involve the comparison of an observed performance level and the device specification performance level. Once the host software receives the asynchronous event indicating compromised performance, the host application may redirect the I/O commands to other storage devices in the system or attached to another system (S460) in order to improve (or in some cases to restrict) performance of the I/O and I/O may be completed (S470).

In various embodiments, a rolling time window comparison may be used for various device attributes such as temperature, power, error rate, or other attribute and an alert (e.g. asynchronous event) may be generated when there is significant deviation from a specification. The host may receive the alert and utilize the available rolling time windows to optimize device usage in view of the alert. For example, drives with an increasing error rates may have their data replicated to a properly functioning drive and I/O may be handled by the properly functioning drive in the future. In another example, drives with increasing power consumption and temperature over a prolonged time window may have a higher incident of device failure and may similarly have their data replicated to another drive with future I/O being directed to the new drive.

In various embodiments, the rolling time window accumulations of error and environmental information may be utilized to predict various device attributes and issues. For example, a potential SSD failure may be predicted based on a sudden increase in error rate or thermal throttling, or shutdown may be predicted based on a rate of temperature increase. Furthermore, the system may diagnose that a decrease in performance is due to an increase in a certain type of error over the same period of time and/or a change in thermal conditions over the same period of time. Multiple rolling window accumulators may be configured to work in parallel and with multiple different time scales. In various embodiments, the system may maintain timescale histories of accumulated values for later comparisons. For example, there may be an accumulator for each performance statistic, error statistic, and environmental statistic of interest. The system may include 4 rolling window accumulators for each statistic with different time scales. For example, the accumulators may include an every second accumulator for the past 1.13 hours, an every minute accumulator covering the past 2.84 days, an every hour accumulator covering the past 170.6 days, and an everyday accumulator covering the past 11.2 years. In this example, 64 KB of space per attribute/statistic to track of space would be required (e.g. 4 time scales×4096 accumulators×4 byte value=64 KB).

Figure 5:
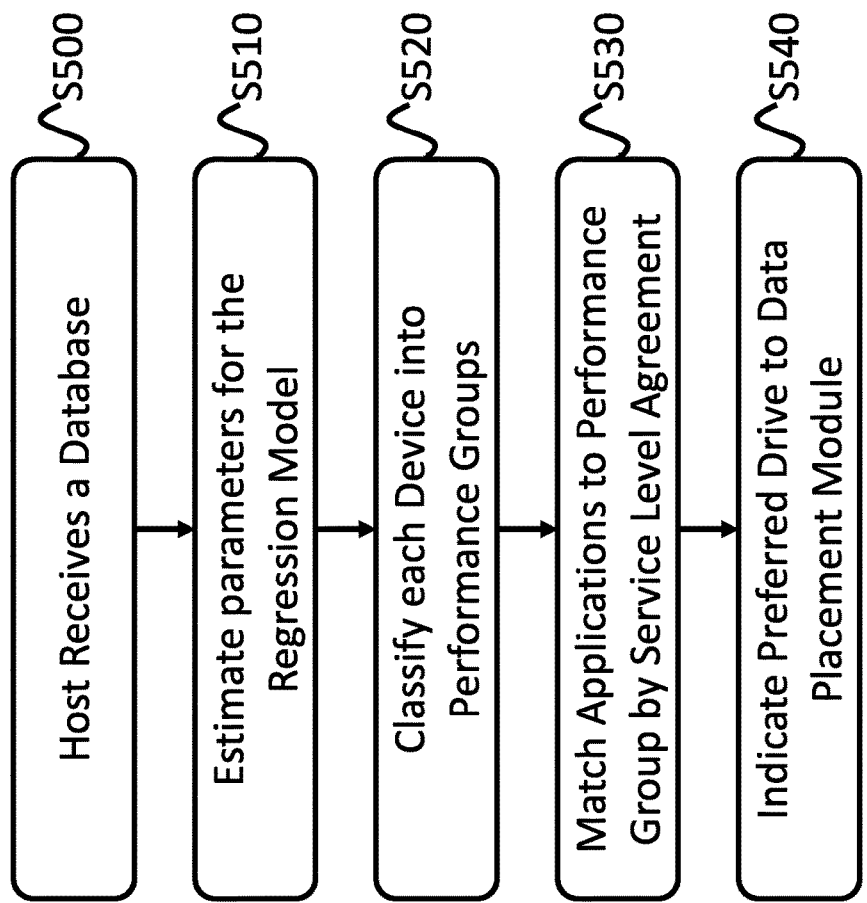
FIG. 5 depicts a method of classifying device performance using a machine learning model according to various embodiments.

FIG. 5 depicts a method of classifying device performance using a machine learning model according to various embodiments.

Referring to FIG. 5, by utilizing the additional telemetry data, the system may be configured to utilize a machine learning model to classify device performance. For example, as detailed above, the system is configured to measure device metrics including device workload, I/O size statistics, and I/O command latency statistics for various I/O ranges. Using the additional metrics, a machine learning model may be trained to classify devices based on throughput or latency and direct I/O accordingly (e.g. to maintain quality of service for certain I/O, selecting data placement by the host I/O stack, selecting a device with the best fit for the I/O size, or rebalancing the weights of SSDs in a cluster for better utilization). In various embodiments, a machine learning model receives a time series database of attributes and features (S500). In various embodiments, the host software may periodically sample performance predicting device attributes (e.g. count of programmable erase blocks, device temperature, etc.), I/O statistics, and I/O latency statistics and stores the time series info in a database, while in other embodiments, the host software may utilize the rolling time window statistics as described above. The various attributes and statistics may then be recorded in a database by the host software. The retrieved attributes and features are then used to by the machine learning model. For example, in some embodiments, the machine learning model may include a regression model (e.g. a linear or polynomial regression model) (S510). The regression model may utilize the provided attributes as predictors (e.g. independent variables) having a direct relationship with a performance level (e.g. the dependent variable). For example, the regression model performance attributes may be modeled as target features with a device's internal attributes as input features.

In other embodiments, the retrieved attributes and features may be used as input for a supervised machine learning model. For example, in various embodiments, the machine learning model may include a Long Short term Memory neural network, or other recurrent neural network configured to analyze sequences of data, such as the described time series of data.

Each device may then be classified by the machine learning model into various performance groups (S520). In one embodiment, the various performance groups may be predefined. The host software may then use application service level agreements (e.g. quality of service requirements) to match the I/O of an application with a performance group (S530). A data placement module may then select a device or for executing new I/O (S540).

Accordingly, the above described embodiments of the present disclosure provide an advanced SSD telemetry system. The advanced SSD telemetry system utilizes a relatively small amount of persistent storage space to provide increased performance statistics that can be leveraged to better provision I/O and predict SSD failures.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A storage device telemetry system comprising:
   at least one solid state drive (SSD);
   a memory;
   a processor configured to execute instructions stored in the memory that, when executed by the processor, cause the processor to:
   execute at least one Input/Output (I/O) instruction on the at least one SSD;
   store an error log information in a persistent memory for other ones of I/O instructions that fail to execute;
   store at least one performance information related to the execution of the at least one I/O instruction, wherein at least one of the error log information or the at least one performance information is for a first rolling time window having a first preselected length, wherein the processor is configured to sample performance statistics of the at least one SSD at specified intervals during the first rolling time window;
   compare the at least one performance information for the first rolling time window with a device specification of the at least one SSD;
   redirect the execution of the at least one I/O instruction to another SSD from the at least one SSD based on determining that a result of comparison between the at least one performance information for the first rolling time window and the device specification of the at least one SSD is less than a threshold;
   configure one of the at least one SSD based on the at least one performance information and a Quality of Service (QoS) requirement,
   provide the at least one performance information for the at least one SSD as features to a machine learning model;
   classify the at least one SSD based on an output of the machine learning model; and
   perform the execution of the at least one I/O instruction based on the classification.

2. The system of claim 1, wherein the at least one performance information comprises at least one of a current number of input/output operations per second (IOPS), an average number of IOPS, a maximum throughput, an available throughput, a latency, a number of host read commands, a number of host write commands, a number of host read/write commands that have misaligned buffers, or a number of recoverable errors.

3. The system of claim 1, wherein the instructions further cause the processor to configure one of the at least one SSD for the execution of the at least one I/O instruction based on one or more of the error log information or the QoS requirement.

4. The system of claim 1, wherein the error log information comprises at least one of an error count, and error timestamp, a command opcode, a status filed, a logical block address (LBA), a namespace, a port, or an error log information overflow flag.

5. The system of claim 1, wherein the at least one performance information is stored in a second rolling time window having a second preselected length.

6. A method of performing storage device telemetry in a storage system, the method comprising:
   executing, by a processor, at least one Input/Output (I/O) instruction from an application operating on the storage system, on a solid state drive (SSD) of a plurality of SSDs;
   storing, in a persistent memory on the SSD, an error log information for other ones of I/O instructions that fail to execute; and
   storing, in the persistent memory on the SSD, at least one performance information related to the execution the at least one I/O instruction, wherein the error log information or the at least one performance information is for a first rolling time window having a first preselected length, wherein the processor is configured to sample performance statistics of the plurality of SSDs at specified intervals during the first rolling time window;
   comparing, by the processor, the at least one performance information for the first rolling time window with a device specification of the SSD;
   configuring a different SSD from the plurality of SSDs for the execution of the at least one I/O instruction based on determining that a result of comparison between the at least one performance information for the first rolling time window and the device specification of the SSD is less than a threshold;
   configuring a different SSD from the plurality of SSDs for the execution of the at least one I/O instruction based on one or more of the error log information or a Quality of Service (QoS) requirement;
   providing the at least one performance information for the SSD as features to a machine learning model;
   classifying the SSD based on an output of the machine learning model; and
   performing the execution of the at least one I/O instruction based on the classification.

7. The method of claim 6, wherein the at least one performance information comprises at least one of a current number of input/output operations per second (IOPS), an average number of IOPS, a maximum throughput, an available throughput, a latency, a number of host read commands, a number of host write commands, a number of host read/write commands that have misaligned buffers, or a number of recoverable errors.

8. The method of claim 6, wherein the error log information comprises at least one of an error count, and error timestamp, a command opcode, a status filed, a logical block address (LBA), a namespace, a port, or an error log information overflow flag.

9. The method of claim 6, wherein the at least one performance information is stored according to a second rolling time window having a second preselected length.

10. A storage device telemetry system, the system comprising:
    a first nonvolatile memory (NVM) and a second NVM;
    a device controller configured execute Input/Output (I/O) operations on the first and second NVM;
    a memory;
    a processor configured to execute instructions stored in the memory that, when executed by the processor, cause the processor to:
    execute at least one I/O instruction from a first application, via the device controller, on the first NVM;
    execute at least one I/O instruction from a second application, via the device controller, on the first NVM;
    store an error log information in a persistent memory on the device controller for other ones of the I/O instructions that fail to execute;
    store at least one performance information related to the execution of the at least one I/O instruction on the device controller, wherein the error log information or the at least one performance information is for a first rolling time window having a preselected length, wherein the processor is configured to sample performance statistics of the first NVM and the second NVM at specified intervals during the first rolling time window;

compare the at least one performance information for the first rolling time window with a device specification of each of the first NVM and the second NVM; and classify the first NVM and the second NVM based on comparing a result of comparison between the at least one performance information for the first rolling time window and the device specification of each of the first NVM and the second NVM with a threshold and a Quality of Service (QoS) requirement; and provide the at least one performance information for the first NVM and the second NVM as features to a machine learning model, wherein the classification of the first NVM and the second NVM is performed according to an output of the machine learning model.

11. The system of claim 10, wherein the instructions are further configured to cause the processor to:

compare the classification of the first NVM to a first QoS agreement for the first application and configure a third NVM for executing the at least one I/O instruction from the first application when the first NVM is classified below a QoS requirement for the first application; and compare the classification of the second NVM to a second QoS agreement for the second application and configure a fourth NVM for executing the at least one I/O instruction from the second application when the second NVM is classified below the QoS requirement for the second application.

12. The system of claim 10, wherein the at least one performance information comprises at least one of a current number of input/output operations per second (IOPS), an average number of IOPS, a maximum throughput, an available throughput, a latency, a number of host read commands, a number of host write commands, a number of host read/write commands that have misaligned buffers, or a number of recoverable errors.

13. The system of claim 10, wherein the error log information comprises at least one of an error count, and error timestamp, a command opcode, a status filed, a logical block address (LBA), a namespace, a port, or an error log information overflow flag.

14. The system of claim 10, wherein the at least one performance information is stored according to a second rolling time window having a second preselected length.

\* \* \* \* \*